United States Patent
Chen et al.

(10) Patent No.: US 6,940,137 B2
(45) Date of Patent: Sep. 6, 2005

(54) SEMICONDUCTOR DEVICE HAVING AN ANGLED COMPENSATION IMPLANT AND METHOD OF MANUFACTURE THEREFOR

(75) Inventors: Jihong Chen, Plano, TX (US); Zhiqiang Wu, Plano, TX (US); Kaiping Liu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/667,012

(22) Filed: Sep. 19, 2003

(65) Prior Publication Data

US 2005/0062103 A1 Mar. 24, 2005

(51) Int. Cl.$^7$ .............................................. H01L 29/72

(52) U.S. Cl. ...................... 257/408; 257/360; 438/199; 438/220; 438/231; 438/302; 438/305

(58) Field of Search ................................. 257/408, 360; 438/199, 220, 302, 305, 200

(56) References Cited

U.S. PATENT DOCUMENTS

| 6,232,827 | B1 | * | 5/2001 | De et al. | 327/537 |
| 6,563,176 | B2 | * | 5/2003 | Gauthier et al. | 257/360 |
| 6,727,131 | B2 | * | 4/2004 | Wu et al. | 438/199 |

* cited by examiner

*Primary Examiner*—Edward Wojciechowicz
(74) *Attorney, Agent, or Firm*—Jacqueline J. Garner; Wade James Brady, III; Frederick J. Telecky, Jr.

(57) ABSTRACT

The present invention provides a semiconductor device 200 having an angled compensation implant, a method of manufacture therefore and a method of manufacturing an integrated circuit including the angled compensation implant. In one embodiment, the method of manufacturing the semiconductor device 200 includes creating a halo implant 240 in a substrate 210, introducing a compensation implant 260 in the substrate 210 at an angle abnormal to the substrate 210 and forming a source/drain region 250 above the compensation implant 260, the angle reducing a capacitance associated with the halo implant 240 or the source/drain region 250. The method further includes placing a gate structure 230 over the substrate 210.

27 Claims, 11 Drawing Sheets

SEMICONDUCTOR DEVICE HAVING AN ANGLED COMPENSATION IMPLANT AND METHOD OF MANUFACTURE THEREFOR

TECHNICAL FIELD OF THE INVENTION

The present invention is directed, in general, to a semiconductor device and, more specifically, to a semiconductor device having an angled compensation implant and a method of manufacture therefor.

BACKGROUND OF THE INVENTION

As the geometries of semiconductor devices and particularly MOS transistors are being scaled to continually shorter gate lengths, there is a requirement for reduction in short channel effects. It is known that these short channel effects can be reduced by the use of non-uniform doping levels in the channel region. One manner of obtaining such non-uniform doping levels in the channel region has been by the use of halo implants. A halo implant involves the introduction of an implant which is at an angle of from about 10 to about 80 degrees and preferably about 10 to 40 degrees relative to a normal to the substrate surface. The halo implant is of opposite conductivity type to that of the source/drain region, is directed partially under the gate electrode and uses the gate electrode as a mask. In this manner, a halo region is formed which abuts the source/drain region as well as the gate oxide, is within the channel region and extends under the gate electrode, to provide a region between the source/drain region and the channel region which is more highly doped than the channel region and of like conductivity type.

Thus, to minimize short channel effects and improve device performance in today's transistor devices, halo implants are used. While the halo implant effectively suppresses punch through from the source to the drain, it unfortunately causes increased parasitic junction capacitance, which has a huge impact on the overall device and circuit performance. Two known parasitic junction capacitances caused by the halo implant include the source/drain bottom wall junction capacitance ($C_{jbot}$) and the source/drain gate sidewall junction capacitance ($C_{jgsw}$).

Turning Briefly to Prior Art FIG. 1, illustrated is a standard semiconductor device 100 having both the source/drain bottom wall junction capacitance ($C_{jbot}$) and the source/drain gate sidewall junction capacitance ($C_{jgsw}$). For illustration purposes, the standard semiconductor device 100 illustrated in FIG. 1 includes a substrate 110, a well 120 and a gate structure 130, including a gate 134, a gate oxide 136 and gate sidewall spacers 138. The standard semiconductor device 100 further includes halo implant regions 140 and source/drain regions 150. Often, conventional lightly doped compensation implants 160 are formed under the source/drain regions 150 to reduce the deep source/drain bottom wall junction capacitance ($C_{jbot}$). The conventional lightly doped compensation implants 160 are implanted at an angle perpendicular to the surface of the substrate 110, and are located between the higher doped source/drain regions 150 and the oppositely doped substrate 110. The perpendicular implantation of the lightly doped compensation implants are typically needed to produce an implant channeling tail for lowering the $C_{jbot}$.

Essentially, the conventional lightly doped compensation implants 160 form a grating or a buffer between these two regions thereby increasing the depletion junction at the bottom of the source/drain regions 150. This grating or buffer reduces the deep source/drain bottom wall junction capacitance ($C_{jbot}$) created between the higher doped source/drain regions 150 and the oppositely doped well 120. Unfortunately, the conventional lightly doped compensation implants 160 do little to reduce the source/drain gate sidewall junction capacitance ($C_{jgsw}$). Similarly, there is nothing known in the art that might help reduce the source/drain gate sidewall junction capacitance ($C_{jgsw}$).

Accordingly, what is needed in the art is a semiconductor device and method of manufacture therefor that has a reduced source/drain gate sidewall junction capacitance ($C_{jgsw}$).

SUMMARY OF THE INVENTION

To address the above-discussed deficiencies of the prior art, the present invention provides a semiconductor device having an angled compensation implant, a method of manufacture therefore and a method of manufacturing an integrated circuit including the angled compensation implant. In one embodiment, the method of manufacturing the semiconductor device includes creating a halo implant in a substrate, introducing a compensation implant in the substrate at an angle abnormal to the substrate and forming a source/drain region above the compensation implant, the angle reducing a capacitance associated with the halo implant or the source/drain region. The method further includes placing a gate structure over the substrate.

Further included within the present invention is a method of manufacturing an integrated circuit including the compensation implant. In addition to that disclosed above, the method for forming the integrated circuit includes forming an interlevel dielectric layer having interconnects located therein over the gate structure, wherein the interconnects contact the semiconductor device to form an operational integrated circuit.

Additionally, the present invention provides a semiconductor device having the compensation implant. The semiconductor device includes: (1) a substrate having a gate structure located thereover, (2) sidewall spacers located along sides of the gate structure, (3) a halo implant located in the substrate, (4) a compensation implant located in the substrate proximate the halo structure and at least about 10 nm under a footprint created by the gate sidewall spacers, and (5) source/drain implants proximate the compensation implant.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

The invention is best understood from the following detailed description when read with the accompanying FIGURES. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which.

Prior Art

DETAILED DESCRIPTION

Figure 2A:
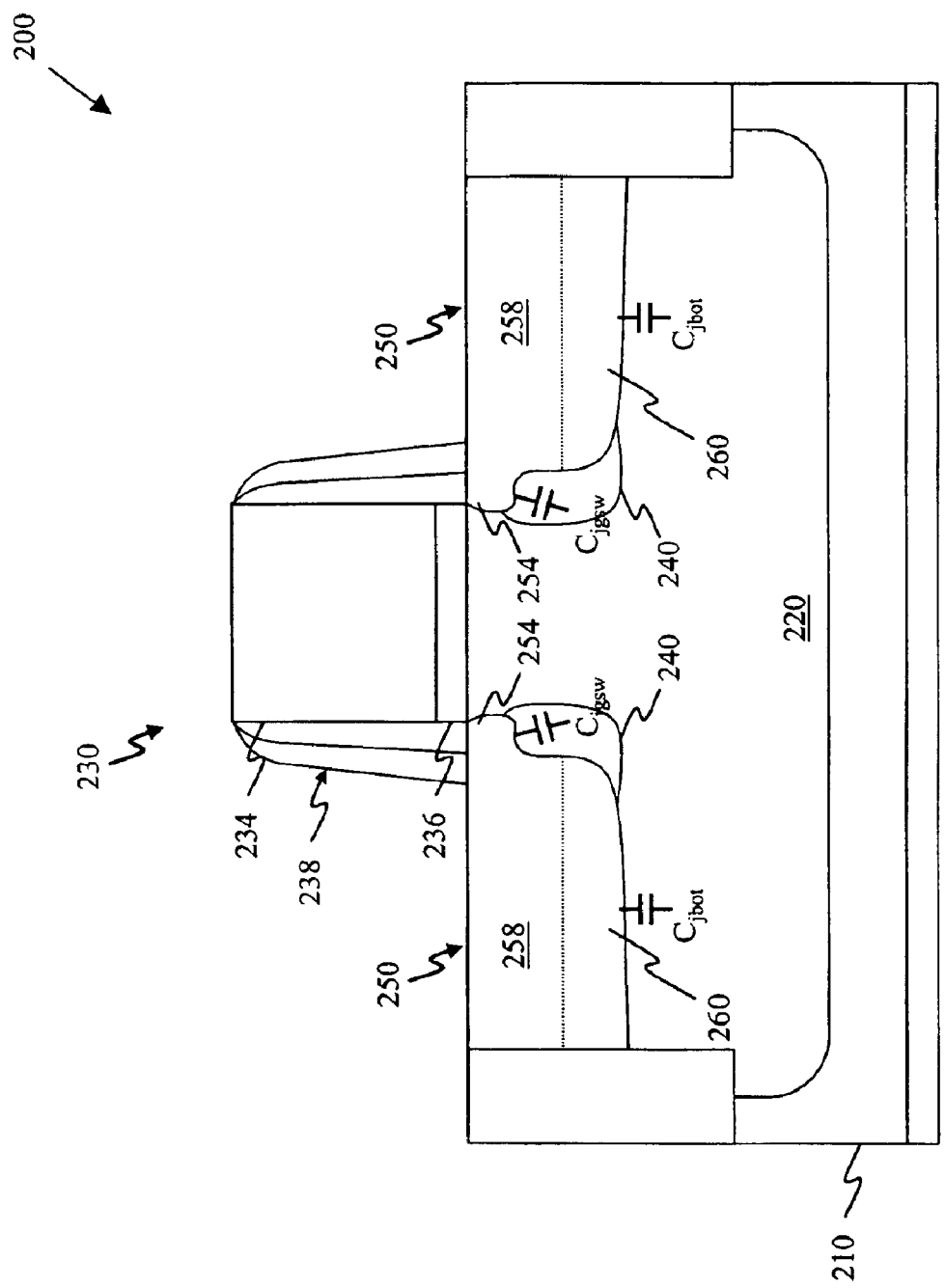
FIG. 2A illustrates a cross-sectional view of one embodiment of a semiconductor device constructed according to the principles of the present invention.

Referring initially to FIG. 2A, illustrated is a cross-sectional view of one embodiment of a semiconductor device 200 constructed according to the principles of the present invention. In the embodiment illustrated in FIG. 2A, the semiconductor device 200 includes a substrate 210. Located within the substrate 210 in the embodiment of FIG. 2A is a well region 220. In the illustrative embodiment of FIG. 2A, a gate structure 230, including a gate 234, a gate oxide 236, and gate sidewall spacers 238, is located over the substrate 210.

The semiconductor device 200 illustrated in FIG. 2A also includes halo implants 240 and conventional source/drain regions 250 located within the substrate 210. The source/drain regions 250, as is common, generally include a lightly doped source/drain implant 254 as well as a higher doped source/drain implant 258.

Optimally located in the substrate 210 under the source/drain regions 250 are compensation implants 260. In accordance with the principles of the present invention the compensation implants 260 are located at least about 10 nm under a footprint created by the gate sidewall spacers 238. In an alternative embodiment, the compensation implants 260 are located from about 10 nm to about 200 nm under the footprint created by the gate sidewall spacers 238.

Unique to the semiconductor device 200 illustrated in FIG. 2A is a reduced source/drain gate sidewall junction capacitance ($C_{jgsw}$). It is believed that the position of the compensation implants 260 allows the area of the junction between the source/drain regions 250 and the halo implants 240 to be dramatically reduced, thereby causing the parasitic source/drain gate sidewall junction capacitance ($C_{jgsw}$) to be reduced. It is further believed that placing the lighter doped compensation implants 260 between the more heavily doped source/drain implants 258 and the heavily doped halo implants 240 creates a grating or buffer, thereby increasing the depletion junction there between. The increased depletion junction further causes the parasitic source/drain gate sidewall junction capacitance ($C_{jgsw}$) to be reduced.

Figure 1:
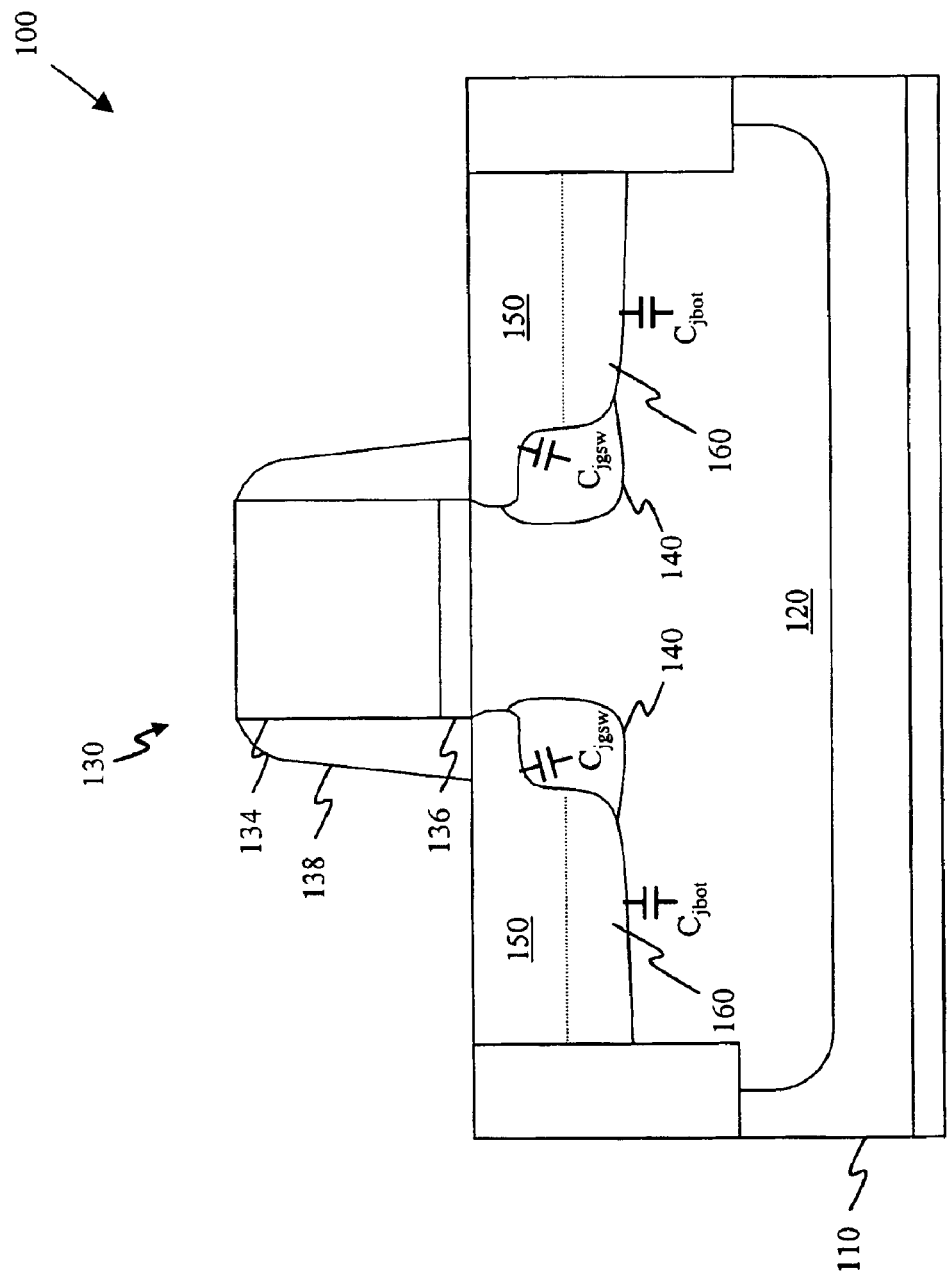
FIG. 1 illustrates a standard semiconductor device having both a source/drain bottom wall junction capacitance ($C_{jbot}$) and a source/drain gate sidewall junction capacitance ($C_{jgsw}$)
Figure 2B:
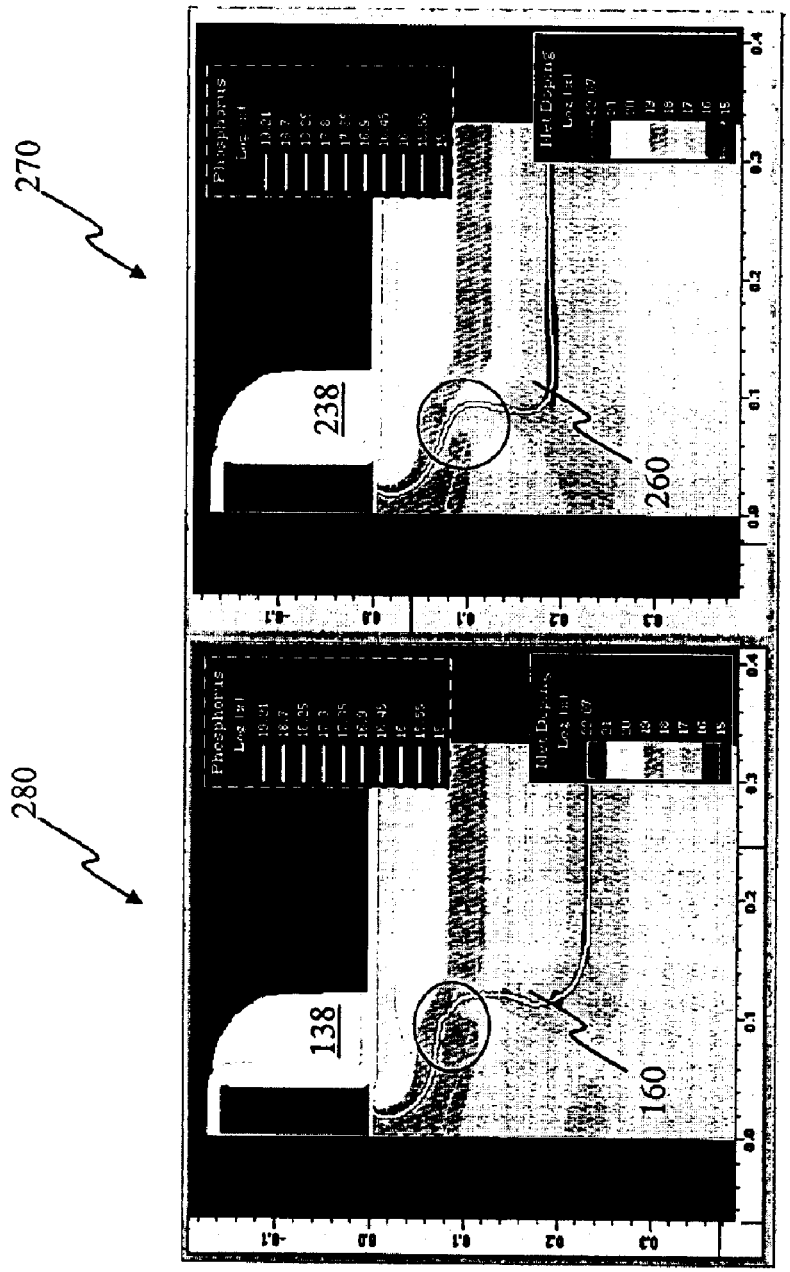
FIG. 2B illustrates a process simulation image of a semiconductor device similar to the semiconductor device shown in FIG. 2A compared to a process simulation image of a semiconductor device similar to the semiconductor device shown in Prior Art FIG. 1.

Turning briefly to FIG. 2B, illustrated is a process simulation image 270 of a semiconductor device similar to the semiconductor device 200 shown in FIG. 2A compared to a process simulation image 280 of a semiconductor device similar to the semiconductor device 100 shown in Prior Art FIG. 1. Take notice how the compensation implant 260 is located under a footprint of the gate sidewalls spacer 238 in the process simulation image 270 and the conventional lightly doped compensation implant 160 is located outside a footprint of the gate sidewall spacer 138 in the process simulation image 280.

As indicated above, the compensation implants 260 of the process simulation image 270 allow for a much lower parasitic source/drain gate sidewall junction capacitance ($C_{jgsw}$) than the conventional lightly doped compensation implants 160. The following Table 1, which represents data taken from the semiconductor devices depicted in the process simulation images 270, 280, supports this theory:

TABLE 1

| Dose | Tilt | $C_{gd}$ | $I_{off}$ | $I_{dsat}$ | $C_{jgsw}$ | % $C_{jgsw}$ Imp. |
|---|---|---|---|---|---|---|
| 5.00E13 | 0 deg. | 0.349 | −1.13E−8 | −3.75E−4 | 0.462 | — |
| 5.00E13 | −15 deg. | 0.347 | −1.21E−8 | −3.75E−4 | 0.369 | 20.1% |
| 6.00E13 | −15 deg. | 0.349 | −1.24E−8 | −3.77E−4 | 0.353 | 23.5% |

Notice that when the compensation implant is formed using an angled implant, such as in the 2nd and 3rd examples, the parasitic source/drain gate sidewall junction capacitance ($C_{jgsw}$) of the device is reduced by up to 20% or more. Also notice how the parasitic gate drain junction capacitance ($C_{gd}$), the $I_{off}$ and the $I_{dsat}$ are not affected by the tilted compensation implant. Thus, in contrast to the prior art, the present invention has the ability to use the halo implants while also have reduced parasitic source/drain gate sidewall junction capacitance ($C_{jgsw}$).

Figure 3:
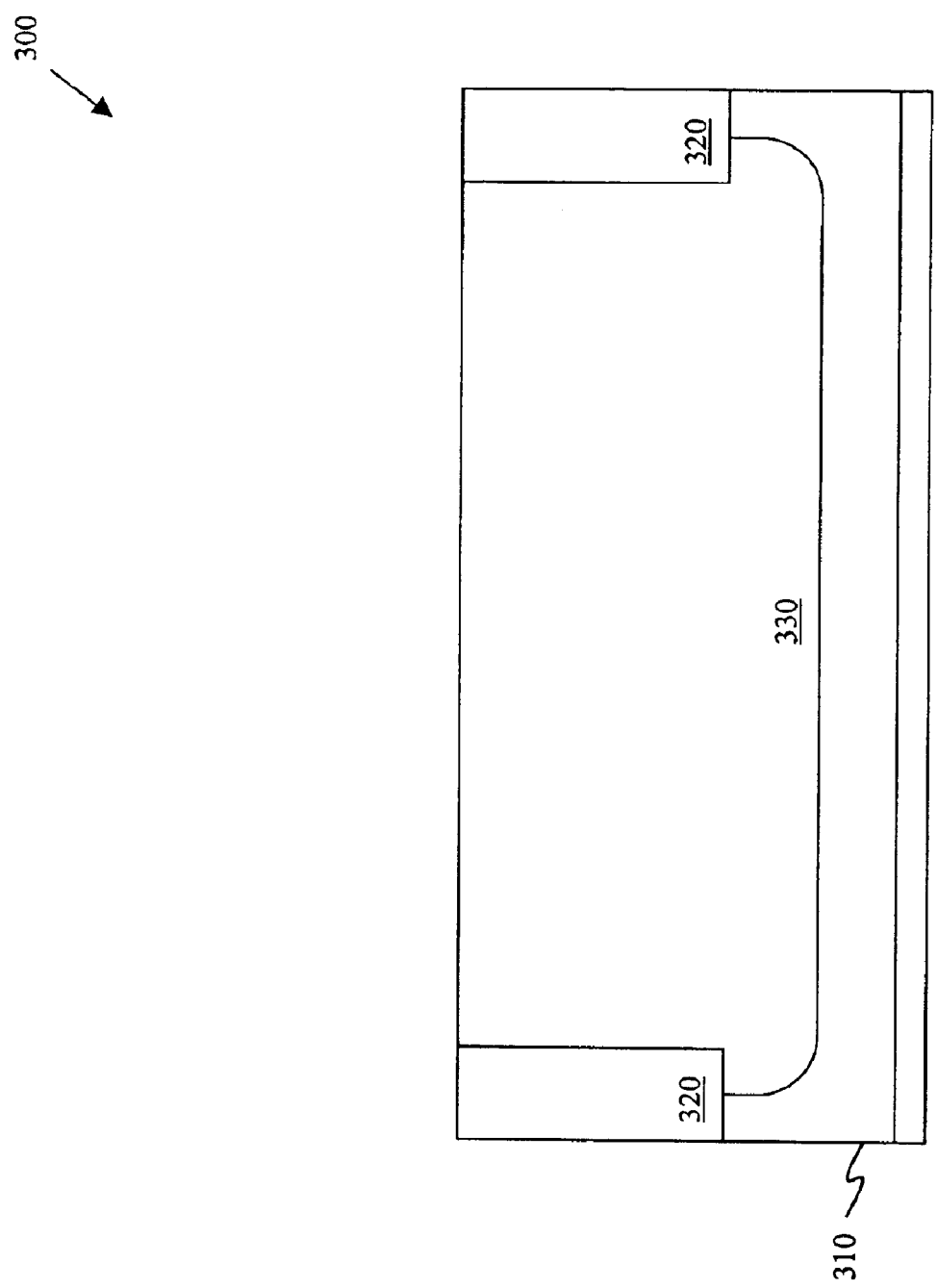
FIG. 3 illustrates a cross-sectional view of a partially completed semiconductor device.

Turning now to FIGS. 3–8, illustrated are cross-sectional views of detailed manufacturing steps instructing how one might, in an advantageous embodiment, manufacture a semiconductor device similar to the semiconductor device 200 depicted in FIG. 2A. FIG. 3 illustrates a cross-sectional view of a partially completed semiconductor device 300. The partially completed semiconductor device 300 includes a substrate 310. The substrate 310 may, in an exemplary embodiment, be any layer located in the partially completed semiconductor device 300, including a wafer itself or a layer located above the wafer (e.g., epitaxial layer). In the embodiment illustrated in FIG. 3, the substrate 310 is a P-type semiconductor substrate; however, one skilled in the art understands that the substrate 310 could be an N-type substrate, without departing from the scope of the present invention. In such a case, each of the dopant types described throughout the remainder of this document would be reversed. For clarity, no further reference to this opposite scheme will be discussed.

Located within the substrate 310 in the embodiment shown in FIG. 3 are shallow trench isolation regions 320. The shallow trench isolation regions 320 isolate the semiconductor device 300 from other devices located proximate thereto. As those skilled in the art understand the various steps used to form these conventional shallow trench isolation regions 320, no further detail will be given.

In the illustrative embodiment of FIG. 3, also formed within the substrate 310 is a well region 330. The well region 330, in light of the P-type semiconductor substrate, would more than likely contain an N-type dopant. For example, the well region 330 would likely be doped with an N-type dopant dose ranging from about 1E13 atoms/cm$^2$ to about 1E14 atoms/cm$^2$ and at a power ranging from about 100 keV to about 500 keV. What generally results is the well region 330 having a peak dopant concentration ranging from about 5E17 atoms/cm$^3$ to about 1E19 atoms/cm$^3$. As those skilled in the art are well aware of the steps generally used to form the well regions 330, no further details will be given.

Figure 4:
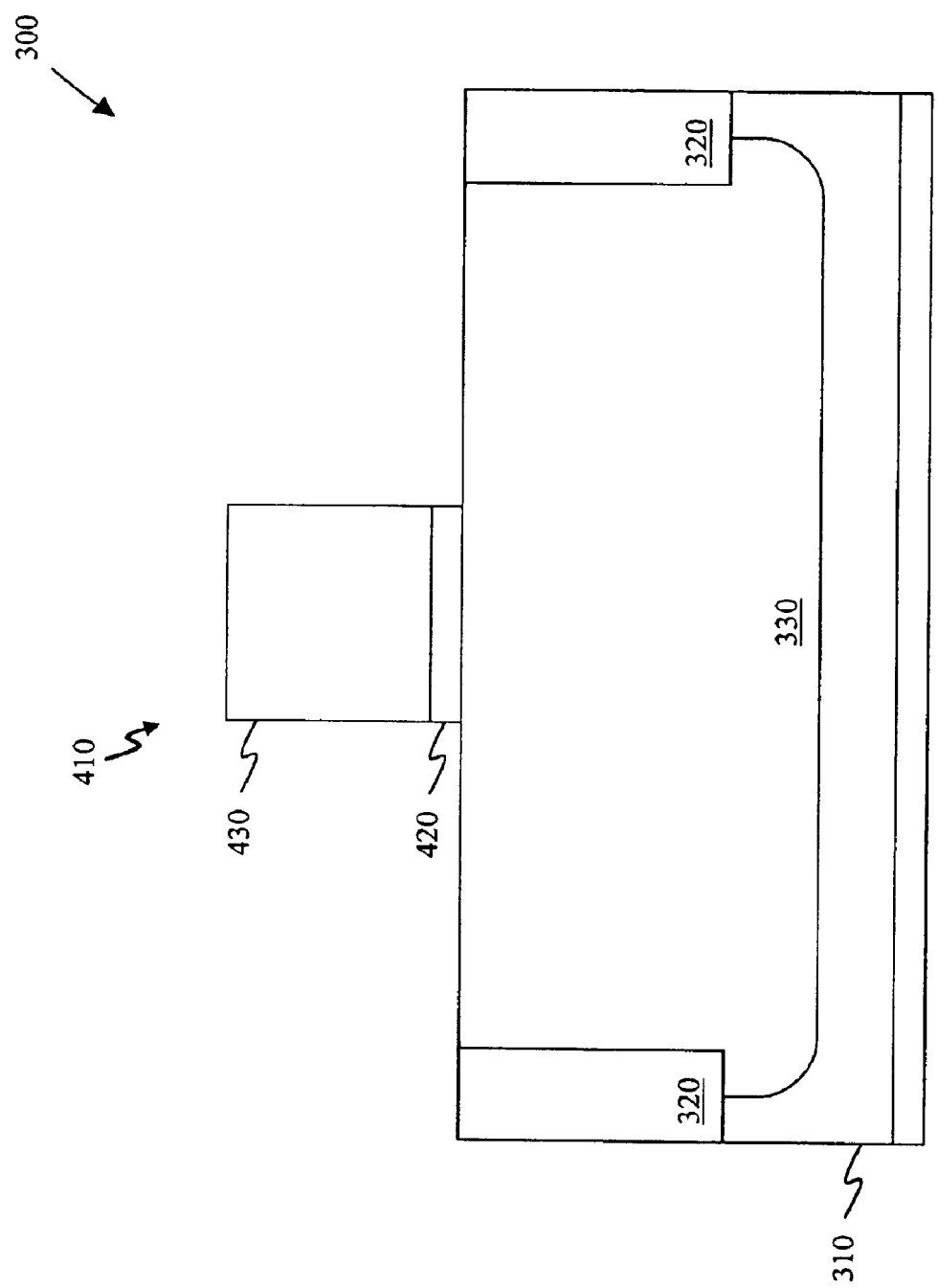
FIG. 4 illustrates a cross-sectional view of the partially completed semiconductor device illustrated in FIG. 3 after formation of a conventional gate structure over the substrate.

Turning now to FIG. 4, illustrated is a cross-sectional view of the partially completed semiconductor device 300 illustrated in FIG. 3 after formation of a conventional gate structure 410 over the substrate 310. As is illustrated in FIG. 4, the gate structure 410 includes a gate oxide 420 and a gate 430. As the gate structure 410 is conventional, those skilled in the art understand the standard steps used for its manufacture, including blanket depositing both a gate oxide layer and gate layer and subsequently using photolithography to define the gate structure 410.

Figure 5:
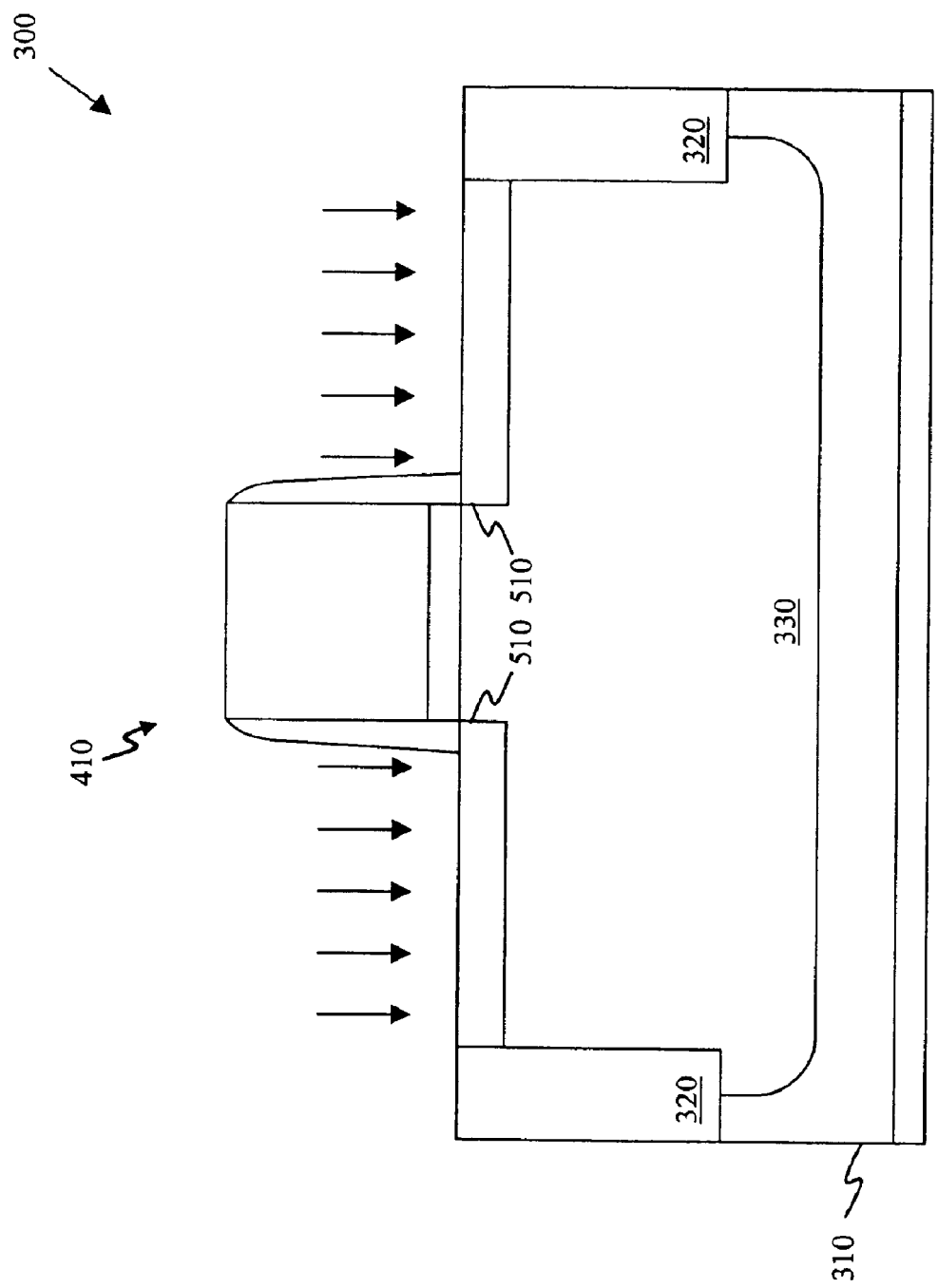
FIG. 5 illustrates a cross-sectional view of the partially completed semiconductor device illustrated in FIG. 4 after formation of lightly doped source/drain implants within the substrate.

Turning now to FIG. 5, illustrated is a cross-sectional view of the partially completed semiconductor device 300 illustrated in FIG. 4 after formation of lightly doped source/drain implants 510 within the substrate 310. The lightly doped source/drain implants 510 are conventionally formed and generally have a peak dopant concentration ranging from about 1E19 atoms/cm$^3$ to about 2E20 atoms/cm$^3$. As is standard in the industry, the lightly doped source/drain implants 510 have a dopant type opposite to that of the well region 330 they are located within. Accordingly, in the illustrative embodiment shown in FIG. 5, the lightly doped source/drain implants 510 are doped with an P-type dopant.

Figure 6:
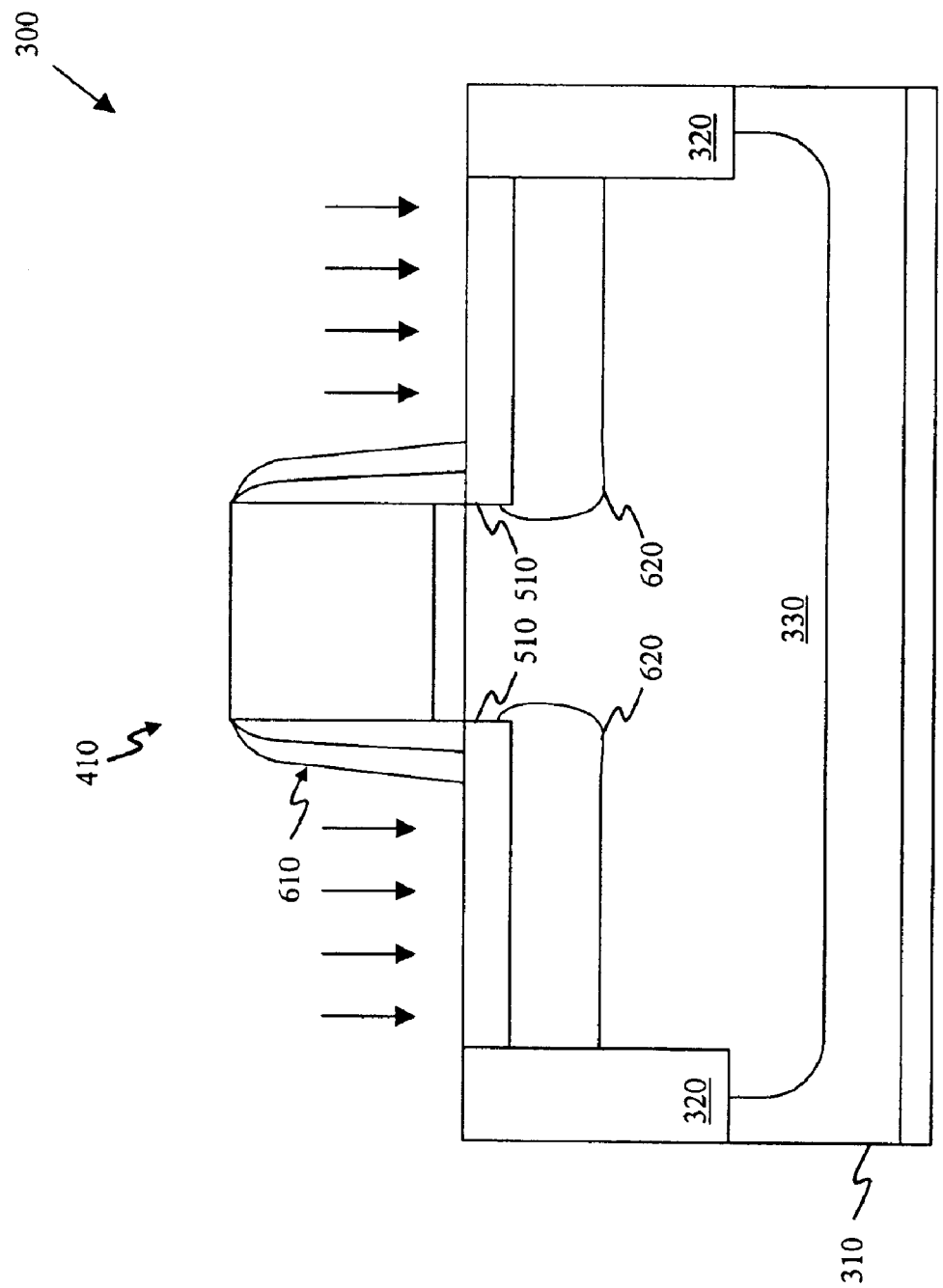
FIG. 6 illustrates a cross-sectional view of the partially completed semiconductor device illustrated in FIG. 5 after formation of conventional gate sidewall spacers and after placing halo implants within the substrate.

Turning now to FIG. 6, illustrated is a cross-sectional view of the partially completed semiconductor device 300 illustrated in FIG. 5 after formation of conventional gate sidewall spacers 610 and after placing halo implants 620 within the substrate 310. The formation of the gate sidewall spacers 610 is conventional. Often the gate sidewall spacers 610 comprise an oxide material that has been anisotropically etched.

The halo implants 620, in the particular embodiment discussed herein, comprise an N-type dopant. For example, in the illustrative embodiment shown in FIG. 6, the halo implants 620 include a phosphorous or arsenic dopant and have a peak dopant concentration ranging from about 1E18 atoms/cm$^3$ to about 1E19 atoms/cm$^3$. While the particular dopant used and dopant concentration of the halo implants 620 have been given, those skilled in the art understand that the present invention should not be limited to such dopants and concentrations. The use and location of the halo implants 620 is particularly designed to reduce short channel effects in the semiconductor device 300.

Figure 7A:
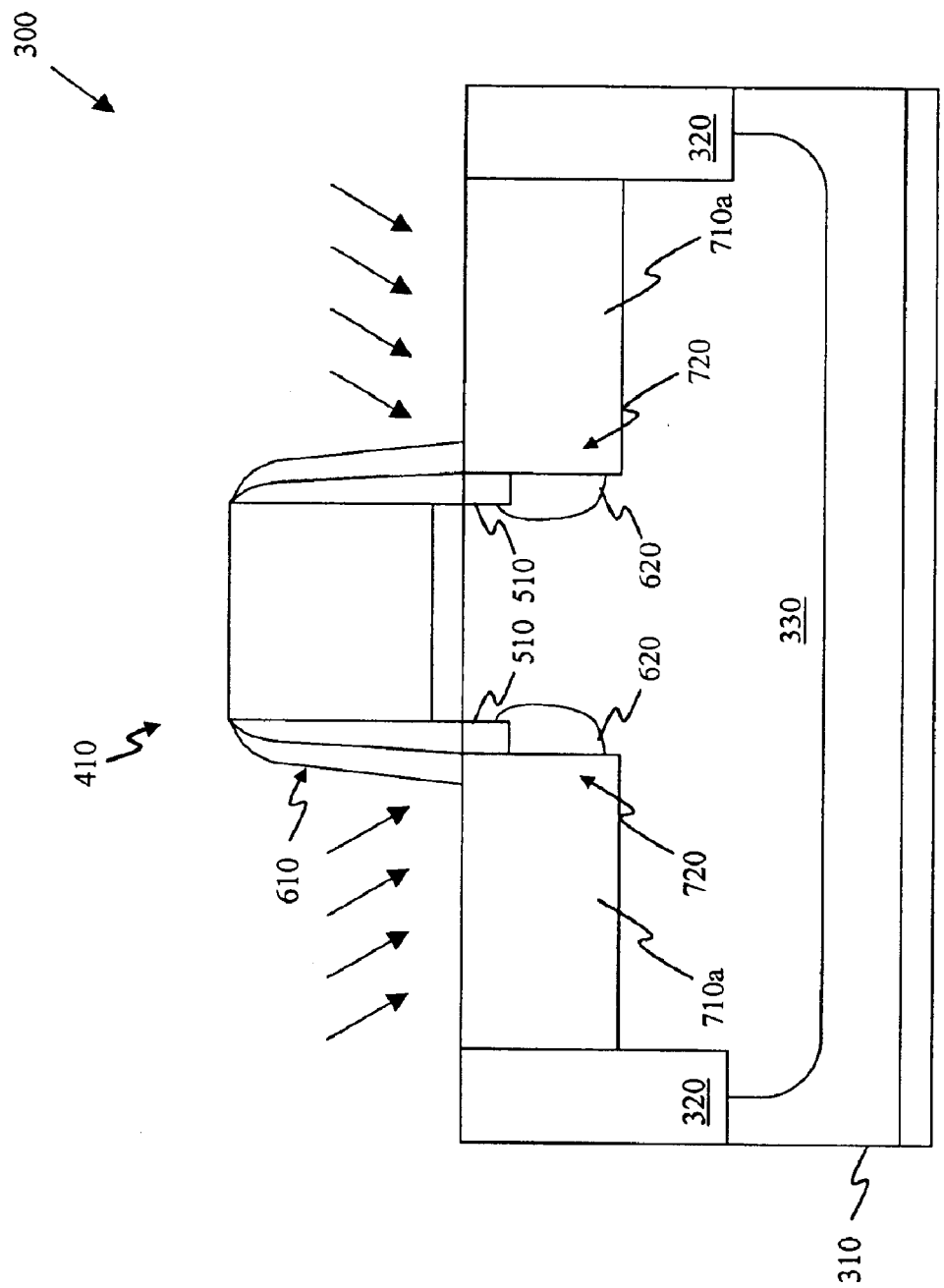
FIG. 7A illustrates a cross-sectional view of the partially completed semiconductor device illustrated in FIG. 6 after introducing compensation implants in the substrate.

Turning now to FIG. 7A, illustrated is a cross-sectional view of the partially completed semiconductor device 300 illustrated in FIG. 6 after introducing compensation implants 710a in the substrate 310. As is indicated in FIG. 7A, and in direct contrast to the prior art, the compensation implants 710a are introduced into the substrate 310 at an angle abnormal to the substrate 310. For example, it has been discovered that an angle from about 5 degrees to about 75 degrees relative to normal of the substrate 310 provides improved capacitance results. It has further been discovered that an angle ranging from about 15 degrees to about 35 degrees also provides improved capacitance results. In contrast to the prior art structures, the angled implant allows the compensation implants 710a to be positioned at least about 10 nm under a footprint created by the sidewall spacers 610, and preferably from about 10 nm to about 200 nm under the footprint created by the gate sidewall spacers 610. Similarly, the angled implant allows the compensation implants 710a to counterdope the halo implants 620, thus creating a counterdoped region 720. This counterdoped region 720, typically has a dopant concentration greater than about ⅓ of a dopant concentration of said halo implants 620.

Generally, the compensation implants 710a comprise a P-type dopant. For example, the compensation implants 710a would likely be doped with a boron dose ranging from about 1E13 atoms/cm$^2$ to about 1E14 atoms/cm$^2$ and at a power ranging from about 10 keV to about 150 keV. What generally results are the compensation implants 710a having a peak dopant concentration ranging from about 1E17 atoms/cm$^3$ to about 1E19 atoms/cm$^3$. While the particular dopant used and dopant concentration of the compensation implants 710a have been given, those skilled in the art understand that the present invention should not be limited to such dopants and concentrations.

Figure 7B:
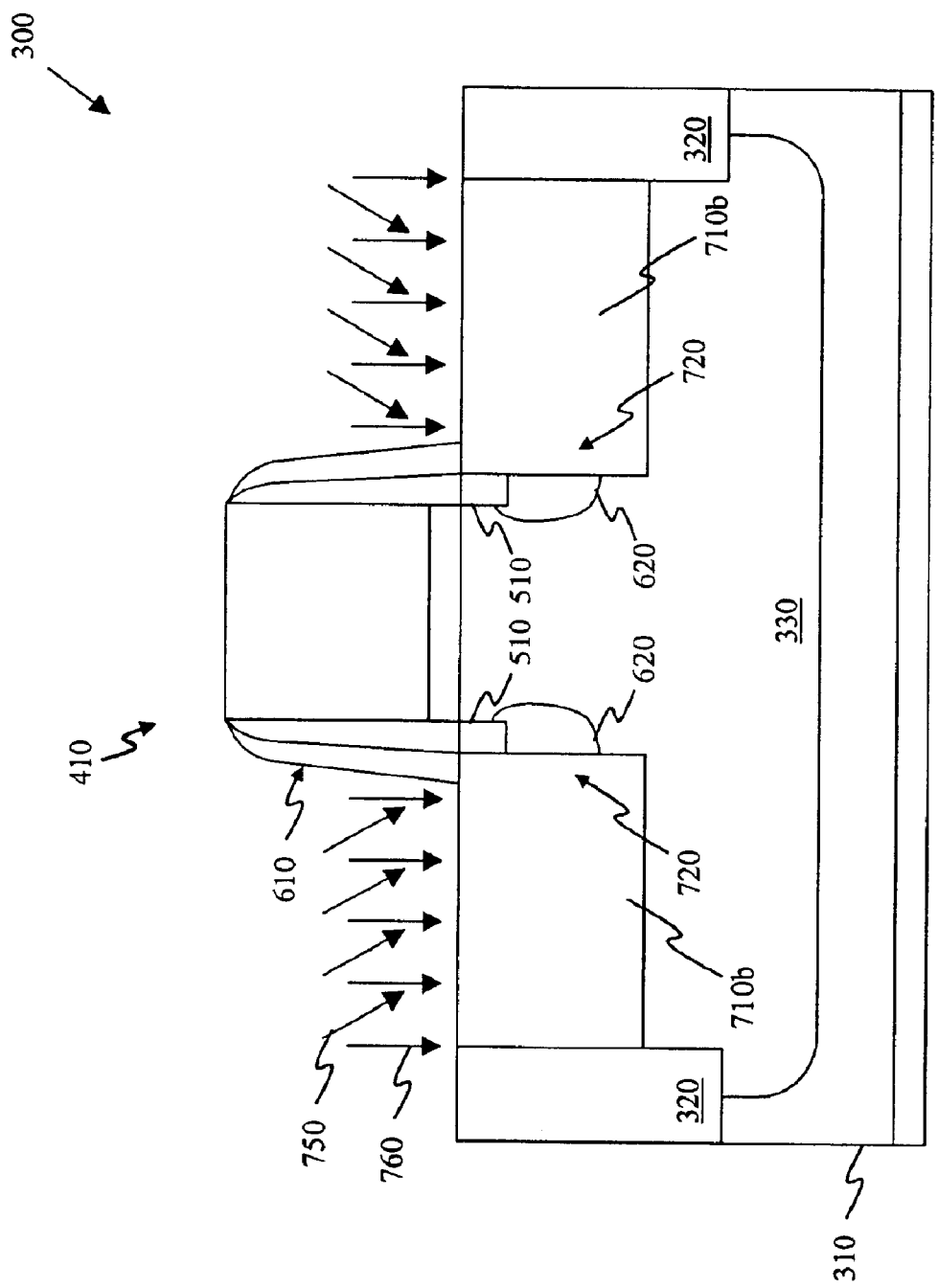
FIG. 7B illustrates a cross-sectional view of an alternative embodiment of the partially completed semiconductor device illustrated in FIG. 6 after introducing compensation implants in the substrate.

Turning now to FIG. 7B, illustrated is a cross-sectional view of an alternative embodiment of the partially completed semiconductor device 300 illustrated in FIG. 6 after introducing compensation implants 710b in the substrate 310. As is indicated in FIG. 7B, and in direct contrast to the prior art, the compensation implants 710b are formed using a first angled compensation implant 750 and a second non-angled (e.g. introduced at an angle substantially normal to the substrate 310) compensation implant 760. What results are compensation implants 710b that have the benefits of the angled compensation implant, however, are deeper than the compensation implants 710a illustrated in FIG. 7A. More than likely the compensation implants 710 will be located deeper than about 10 nm into the substrate 310.

The second non-angled compensation implant may be introduced using a dose ranging from about 5E12 atoms/cm$^2$ to about 1E14 atoms/cm$^2$, resulting in a concentration of less than about 2E18 atoms/cm$^3$ at the lower portion of the compensation implant 710b. The first and second compensation implants 750, 760, should have the same type dopant. Also, the first and second compensation implants 750, 760, may be formed simultaneously, or may be formed one before the other.

Figure 8:
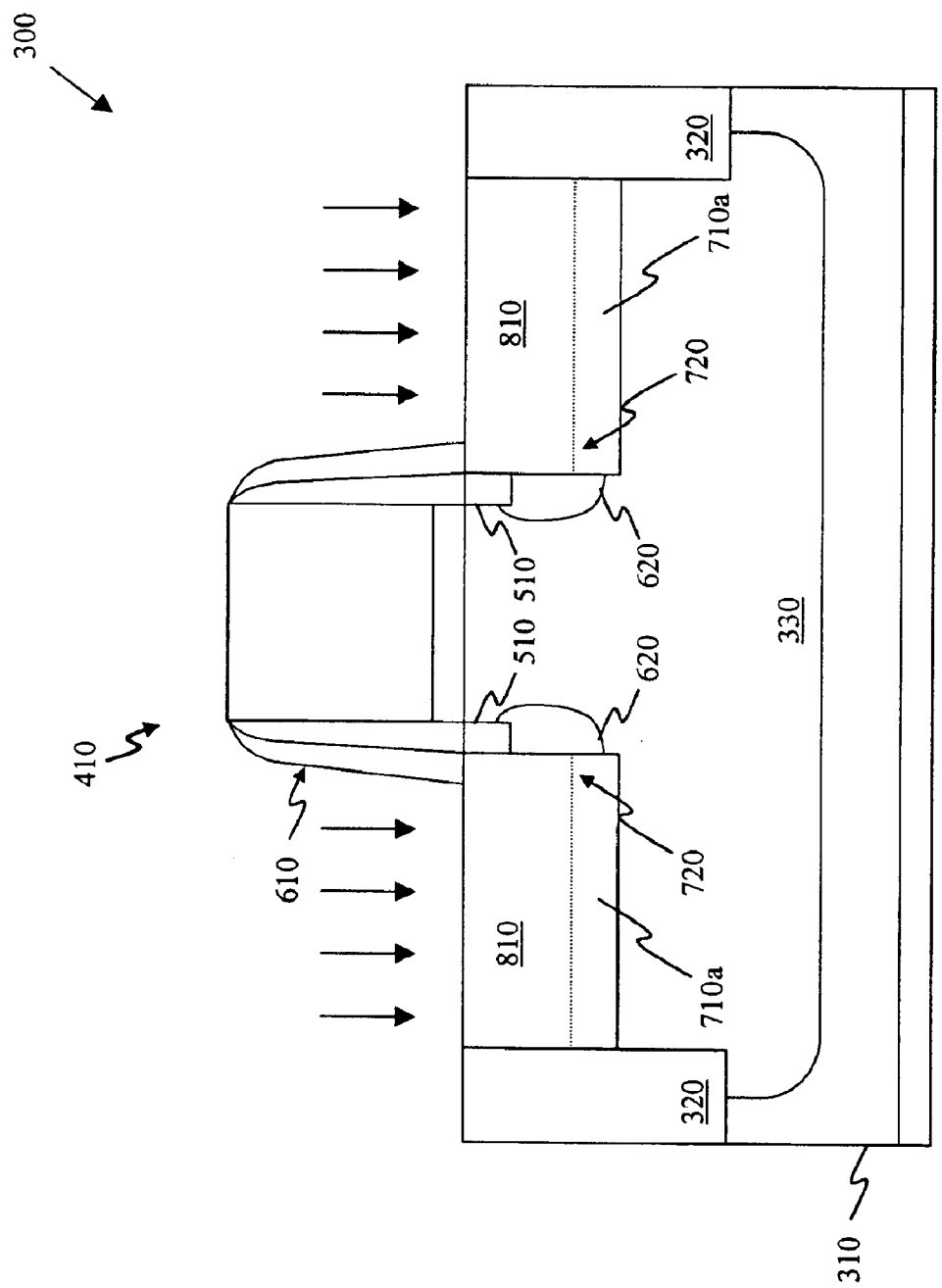
FIG. 8 illustrates a cross-sectional view of the partially completed semiconductor device illustrated in FIG. 7 after formation of highly doped source/drain implants within the substrate.

Turning now to FIG. 8, illustrated is a cross-sectional view of the partially completed semiconductor device 300 illustrated in FIG. 7A after formation of highly doped source/drain implants 810 within the substrate 310. The highly doped source/drain implants 810 are conventionally formed and generally have a peak dopant concentration ranging from about 1E18 atoms/cm$^3$ to about 1E21 atoms/cm$^3$. Also, the highly doped source/drain implants 810 should typically have a dopant type opposite to that of the well region 310 they are located within. Accordingly, in the illustrative embodiment shown in FIG. 8, the highly doped source/drain implants 810 are doped with a P-type dopant. What results after formation of the highly doped source/drain implants 810 is a device similar to the semiconductor device 200 illustrated in FIG. 2A.

Figure 9:
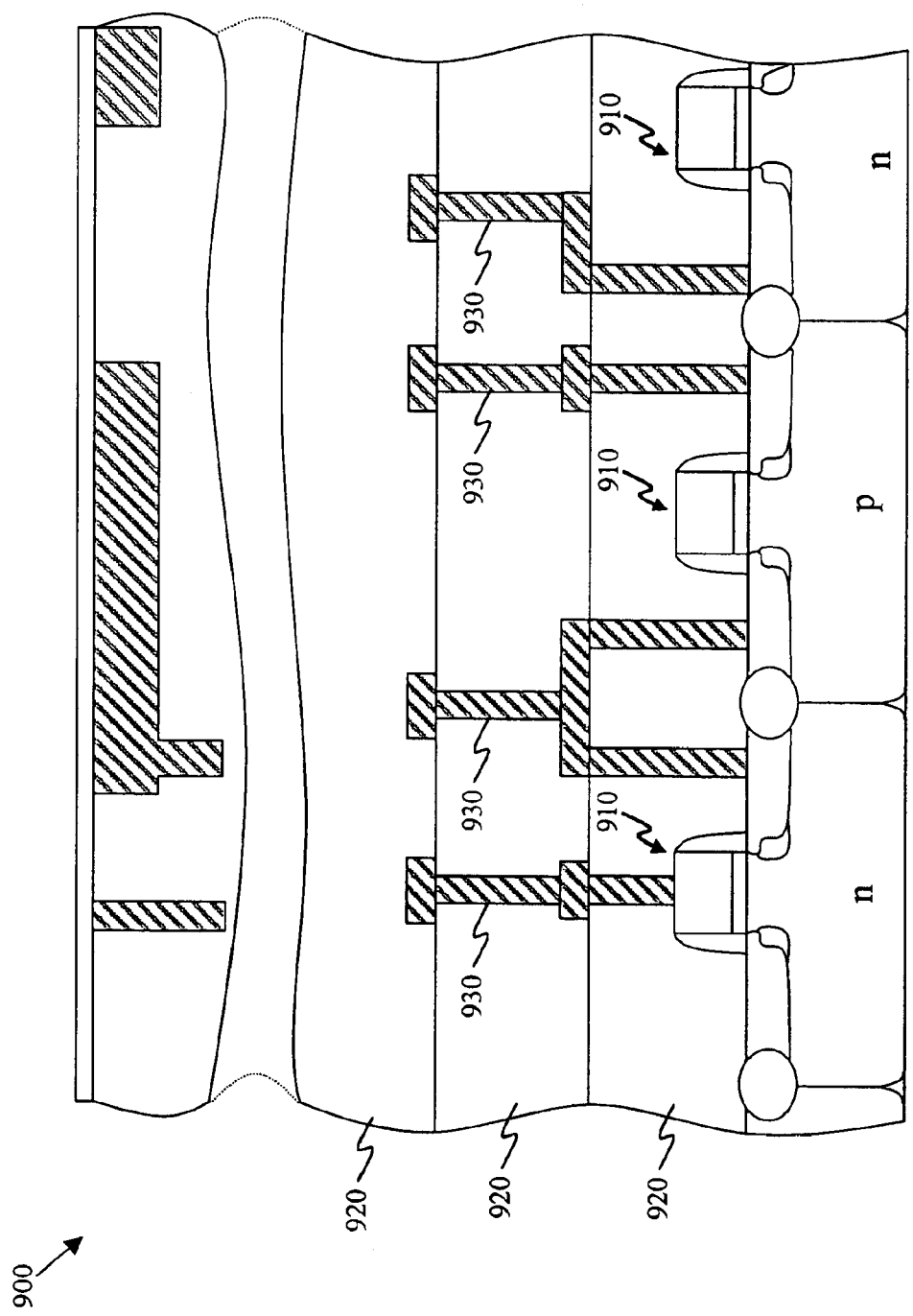
FIG. 9 illustrates a cross-sectional view of a conventional integrated circuit (IC) incorporating semiconductor devices constructed according to the principles of the present invention.

Referring finally to FIG. 9, illustrated is a cross-sectional view of a conventional integrated circuit (IC) 900 incorporating semiconductor devices 910 constructed according to the principles of the present invention. The IC 900 may include devices, such as transistors used to form CMOS devices, BiCMOS devices, Bipolar devices, or other types of devices. The IC 900 may further include passive devices, such as inductors or resistors, or it may also include optical devices or optoelectronic devices. Those skilled in the art are familiar with these various types of devices and their manufacture. In the particular embodiment illustrated in FIG. 9, the IC 900 includes the semiconductor devices 910 having dielectric layers 920 located thereover. Additionally, interconnect structures 930 are located within the dielectric layers 920 to interconnect various devices, thus, forming the operational integrated circuit 900.

Although the present invention has been described in detail, those skilled in the art should understand that they can make various changes, substitutions and alterations herein without departing from the spirit and scope of the invention in its broadest form.

What is claimed is:

1. A method of manufacturing a semiconductor device, comprising:
    providing a substrate;
    placing a gate structure having a gate sidewall spacer over said substrate;
    creating a halo implant in said substrate on opposing sides of said gate structure;
    introducing a compensation implant in said substrate proximate said halo implant at an angle abnormal to said substrate; and
    forming a source/drain region proximate said compensation implant, said angle reducing a capacitance associated with said halo implant or said source/drain region.

2. The method as recited in claim 1 wherein the step of introducing a compensation implant includes introducing a compensation implant at an angle from about 5 degrees to about 75 degrees relative to normal of said substrate.

3. The method as recited in claim 1 wherein the step of introducing a compensation implant includes introducing a compensation implant at an angle from about 15 degrees to about 35 degrees relative to normal of said substrate.

4. The method as recited in claim 1 wherein said compensation implant extends from beneath the footprint of said gate sidewall spacer toward and under said source/drain region.

5. The method as recited in claim 1 wherein said compensation implant forms a dopant gradient between said halo implant and said source/drain region, thereby reducing said capacitance.

6. The method as recited in claim 1 wherein said steps of introducing and forming includes introducing and forming using a similar type dopant and said creating includes creating using an opposite type dopant.

7. The method as recited in claim 1 wherein said source/drain region includes a lightly doped source/drain implant and a heavily doped source/drain implant.

8. The method as recited in claim 1 further including the step of forming gate sidewall spacers along sides of said gate structure, wherein said compensation implant is located at least about 10 nm under a footprint created by said gate sidewall spacers.

9. The method as recited in claim 8 wherein said compensation implant is located from about 10 nm to about 200 nm under said footprint created by said gate sidewall spacers.

10. The method as recited in claim 1 wherein said step of creating occurs before said introducing and said introducing occurs before said forming.

11. The method as recited in claim 1 wherein introducing a compensation implant includes creating a counterdoped region in said halo implant.

12. The method as recited in claim 11 wherein said counterdoped region has a dopant concentration greater than about ⅓ of a dopant concentration of said halo implant.

13. The method as recited in claim 1 wherein the stop of introducing a compensation implant includes introducing a first compensation implant and further including introducing a second compensation implant in said substrate proximate said halo implant at an angle substantially normal to said substrate.

14. The method as recited in claim 13 wherein said steps of introducing a first compensation implant and said introducing a second compensation implant occur simultaneously.

15. A method of manufacturing an integrated circuit, comprising:
    creating a semiconductor device, including;
        providing a substrate;
        placing a gate structure over said substrate having sidewalls;
        creating a halo implant in said substrate on opposing sides of said gate structure;
        introducing a compensation implant in said substrate proximate said halo implant at an angle abnormal to said substrate; and
        forming a source/drain region proximate said compensation implant, said angle reducing a capacitance associated with said halo implant or said source/drain region; and
    constructing an interlevel dielectric layer located over said semiconductor device and having interconnects located therein, wherein said interconnects contact said semiconductor device to form an operational integrated circuit.

16. The method as recited in claim 15 wherein the step of introducing a compensation implant includes introducing a compensation implant at an angle from about 15 degrees to about 35 degrees relative to normal of said substrate.

17. The method as recited in claim 15 wherein said compensation implant extends from beneath the footprint of said gate sidewall spacer toward and under said source/drain region.

18. The method as recited in claim 15 wherein said steps of introducing and said forming includes introducing and forming using a similar type dopant and said creating includes creating using an opposite type dopant.

19. The method as recited in claim 15 wherein said source/drain region includes a lightly doped source/drain implant and a heavily doped source/drain implant.

20. The method as recited in claim 15 further including the step of forming gate sidewall spacers along sides of said gate structure, wherein said compensation implant is located at least about 10 nm under a footprint created by said gate sidewall spacers.

21. The method as recited in claim 1 wherein introducing a compensation implant includes creating a counterdoped region in said halo implant.

22. The method as recited in claim 21 wherein said counterdoped region has a dopant concentration greater than about ⅓ of a dopant concentration of said halo implant.

23. The method as recited in claim 1 wherein the steps of introducing a compensation implant includes introducing a first compensation implant and further including introducing a second compensation implant in said substrate proximate said halo implant at an angle substantially normal to said substrate.

24. The method as recited in claim 23 wherein said steps of introducing a first compensation implant and said introducing a second compensation implant occur simultaneously.

25. The method as recited in claim 15 further including the step of forming a second semiconductor device proximate said semiconductor device, wherein said second semiconductor device is selected from the group of devices consisting of:
- a MOS device;
- a bipolar device;
- an inductor;
- a resistor;
- an optical device; and
- a micro-electro-mechanical system (MEMS) device.

26. A semiconductor device, comprising;
- a substrate having a gate structure located thereover;
- sidewall located along sides of said gate structure;
- a halo implant located in said substrate on opposing sides of said sidewall spacers;
- a compensation implant located in said substrate proximate said halo implant and at least about 10 nm under a footprint created by said gate sidewall spacers; and
- a source/drain region located proximate said compensation implant.

27. The semiconductor device as recited in claim 18 wherein said compensation implant is located from about 10 nm to about 200 nm under said footprint created by said gate sidewall spacers.

* * * * *